United States Patent [19]

Alexis

[11] Patent Number: 5,640,083
[45] Date of Patent: Jun. 17, 1997

[54] METHOD AND APPARATUS FOR IMPROVING POWER UP TIME OF FLASH EEPROM MEMORY ARRAYS

[75] Inventor: Ranjeet Alexis, Folsom, Calif.

[73] Assignee: Intel Corporation, Santa Clara, Calif.

[21] Appl. No.: 458,805

[22] Filed: Jun. 2, 1995

[51] Int. Cl.$^6$ .................................................. G05F 3/16
[52] U.S. Cl. .................................... 323/313; 327/536
[58] Field of Search ................................. 323/312, 313; 327/535, 536, 538, 539

[56] References Cited

U.S. PATENT DOCUMENTS

| | | | |
|---|---|---|---|
| 3,747,582 | 7/1973 | Kato | 123/599 |
| 3,753,010 | 8/1973 | Haraszti | 327/212 |
| 4,219,872 | 8/1980 | Engelmann | 363/126 |
| 5,283,765 | 2/1994 | Oh | 365/230.8 |
| 5,424,670 | 6/1995 | Samuels et al. | 327/337 |

*Primary Examiner*—Matthew V. Nguyen
*Attorney, Agent, or Firm*—Blakely, Sokoloff, Taylor & Zafman

[57] ABSTRACT

A circuit for rapidly raising the value of voltage at a circuit node to a predetermined precise level including first and second charging circuits, and circuitry including a timing circuit responsive to an enabling signal for connecting the one of the charging circuits to the circuit node for a first limited period and then connecting the other of the charging circuits to the circuit node thereafter.

26 Claims, 3 Drawing Sheets

5,640,083

METHOD AND APPARATUS FOR IMPROVING POWER UP TIME OF FLASH EEPROM MEMORY ARRAYS

BACKGROUND OF THE INVENTION

1. Field of the Invention

This invention relates to computer circuitry and, more particularly, to methods and apparatus for providing a reference voltage value.

2. History of the Prior Art

In electronic circuitry, it is often necessary to provide a voltage of an exact level for some operation. Moreover, there are situations in which is necessary to provide a voltage of an exact level for some operation at some circuit node which must be charged from some other voltage level.

Where a voltage at a node may vary but must be precisely determined at some instant, there may be a requirement that the node be brought to the appropriate voltage level very rapidly. Typically, the manner in which this is accomplished to a furnish a great deal of current from a power source capable of furnishing high levels of power. There are situations where this is not possible because of power constraints or other circuit constraints. For example, portable computer may lack a source of power sufficient to provide the current necessary to charge a node with substantial inherent capacitance rapidly enough. Even if sufficient power is available, the circuit components may not be capable of providing the current necessary to charge a node at a sufficiently rapid pace. For example, the circuit elements may be constrained in the amount of current they may deliver for other circuit reasons.

It is desirable to be able to provide a voltage of an exact level for operations at circuit nodes at which the voltage must be raised, and it is desirable to provide such a voltage very rapidly.

SUMMARY OF THE INVENTION

It is, therefore, an object of the present invention to provide apparatus and a method for providing precise regulated voltages very rapidly.

These and other objects of the present invention are realized using apparatus which includes first and second reference circuits. The first reference circuit is used to provide a precise regulated voltage at a circuit node but typically requires a period longer than desirable to charge the circuit node because of circuit or power constraints. The second reference circuit provides rapid charging to a voltage level slightly lower than the desired voltage. When a signal is applied to indicate that the node is to be charged, the output of the second voltage reference circuit is immediately applied to the node; and after some predetermined period sufficient to allow the output of the first voltage reference circuit to reach the level of the output of the second voltage reference circuit, the output of the first voltage reference circuit is applied to the node while the output of the second voltage reference circuit is removed from the node. This raises the node rapidly almost to the desired level while allowing the first voltage reference circuit to charge rapidly because of the absence of load, and leaves only a small charge level necessary for the first voltage reference circuit to charge the node after the switching of reference circuits occurs. The entire operations occurs much more rapidly than does charging by a single reference circuit.

These and other objects and features of the invention will be better understood by reference to the detailed description which follows taken together with the drawings in which like elements are referred to by like designations throughout the several views.

NOTATION AND NOMENCLATURE

Some portions of the detailed descriptions which follow are presented in terms of symbolic representations of operations on data bits within a computer memory. These descriptions and representations are the means used by those skilled in the data processing arts to most effectively convey the substance of their work to others skilled in the art. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. Useful machines for performing the operations of the present invention include general purpose digital computers or other similar devices. In all cases the distinction between the method operations in operating a computer and the method of computation itself should be borne in mind. The present invention relates to a method and apparatus for operating a computer in processing electrical or other (e.g. mechanical, chemical) physical signals to generate other desired physical signals.

DETAILED DESCRIPTION

Figure 1:
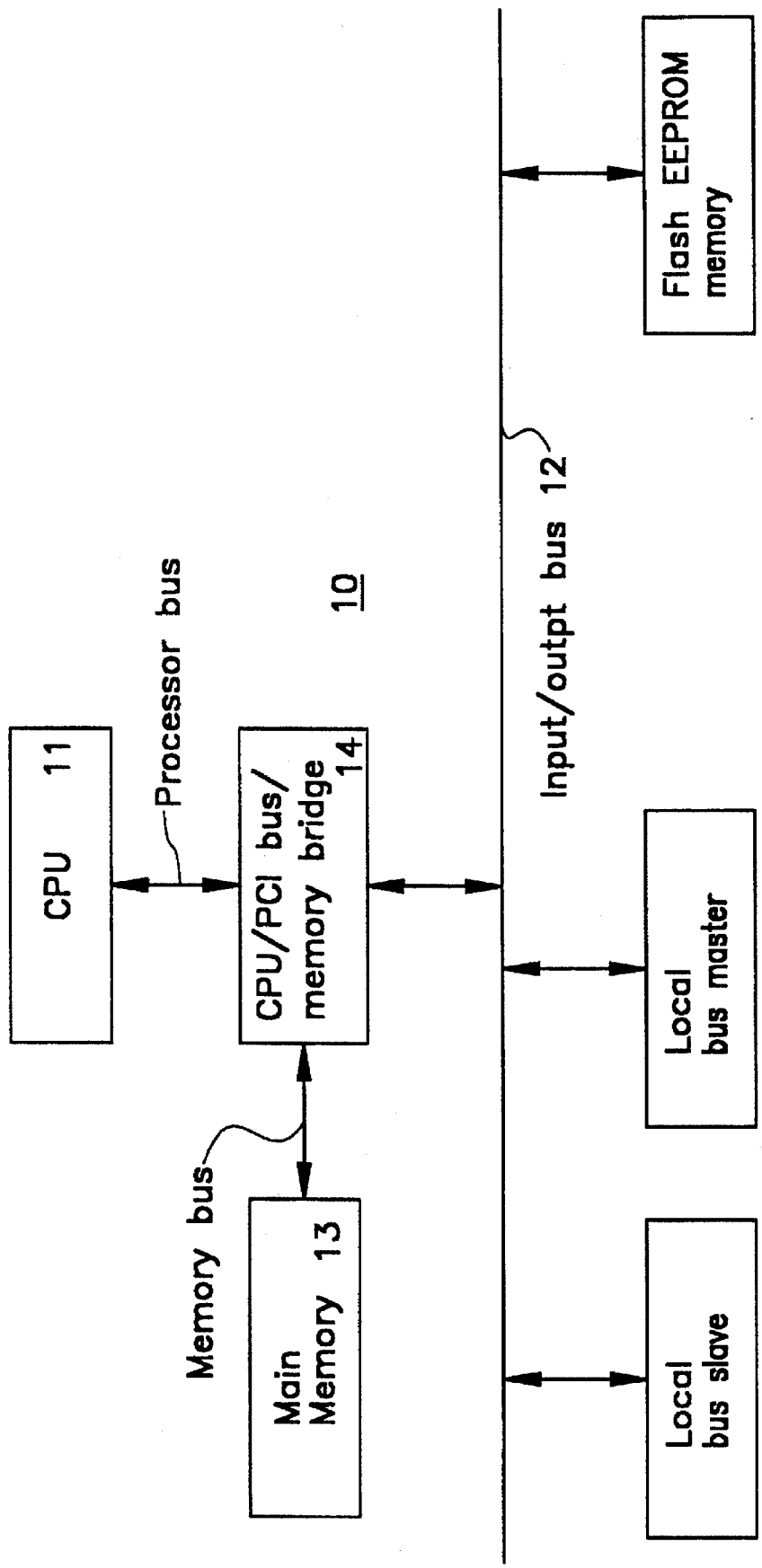
FIG. 1 is a block diagram of a computer system which may utilize the present invention.

Referring now to FIG. 1, there is illustrated a block diagram of a digital system 10 configured in accordance with one embodiment of the present invention. The present invention has application in any system, including a computer system, utilizing circuitry in which a voltage level at a node should be very precisely controlled and in which the value must be rapidly reached. The system 10 illustrated includes a central processing unit 11 which executes the various instructions provided to control the operations of the system 10. The central processing unit 11 is typically joined by a processor bus to a bridge circuit 14 which controls access to an input/output bus 12 adapted to carry information between the various components of the system 10. The bridge 14 is also typically joined by a memory bus to main memory 13 which is typically constructed of dynamic random access memory arranged in a manner well known to those skilled in the prior art to store information during a period in which power is provided to the system 10. In FIG. 1, the bus 12 is preferably a peripheral component interface (PCI) bus or other local bus adapted to provide especially fast transfers of data. In a typical system 10, various input/output devices are connected as bus master and bus slave circuits to the bus 12.

In addition to the usual input/output devices typically joined to a system bus 12, additional memory may be provided for the system by a flash EEPROM memory array which may be positioned on the bus. A flash EEPROM memory array is one instance in which the present invention finds use in a computer system. A flash EEPROM memory array is constructed of a large plurality of floating-gate metal-oxide-silicon field effect transistor devices arranged as memory cells in typical row and column fashion with circuitry for accessing individual cells and placing the memory transistors of those cells in different memory conditions. Such memory transistors may be programmed by storing a charge on the floating gate. This charge remains when power is removed from the array. The charge level may be detected by interrogating the devices.

In order to detect the value of the charges stored in one type of flash memory manufactured by Intel Corporation of Santa Clara, Calif., reference cells are provided which utilize additional flash EEPROM devices to furnish reference currents to each of the sensing outputs of each word. The current through the flash storage cells is compared with these reference currents through the flash reference cells to determine whether a "zero" or a "one" condition exists in the flash storage cells. Typically, the reference currents are relatively small so that it takes some time to bring the voltage at a comparison node to a steady state level. On the other hand, in order to make access time as short as possible, it is desirable to power up the reference cell as rapidly as possible.

Figure 2:
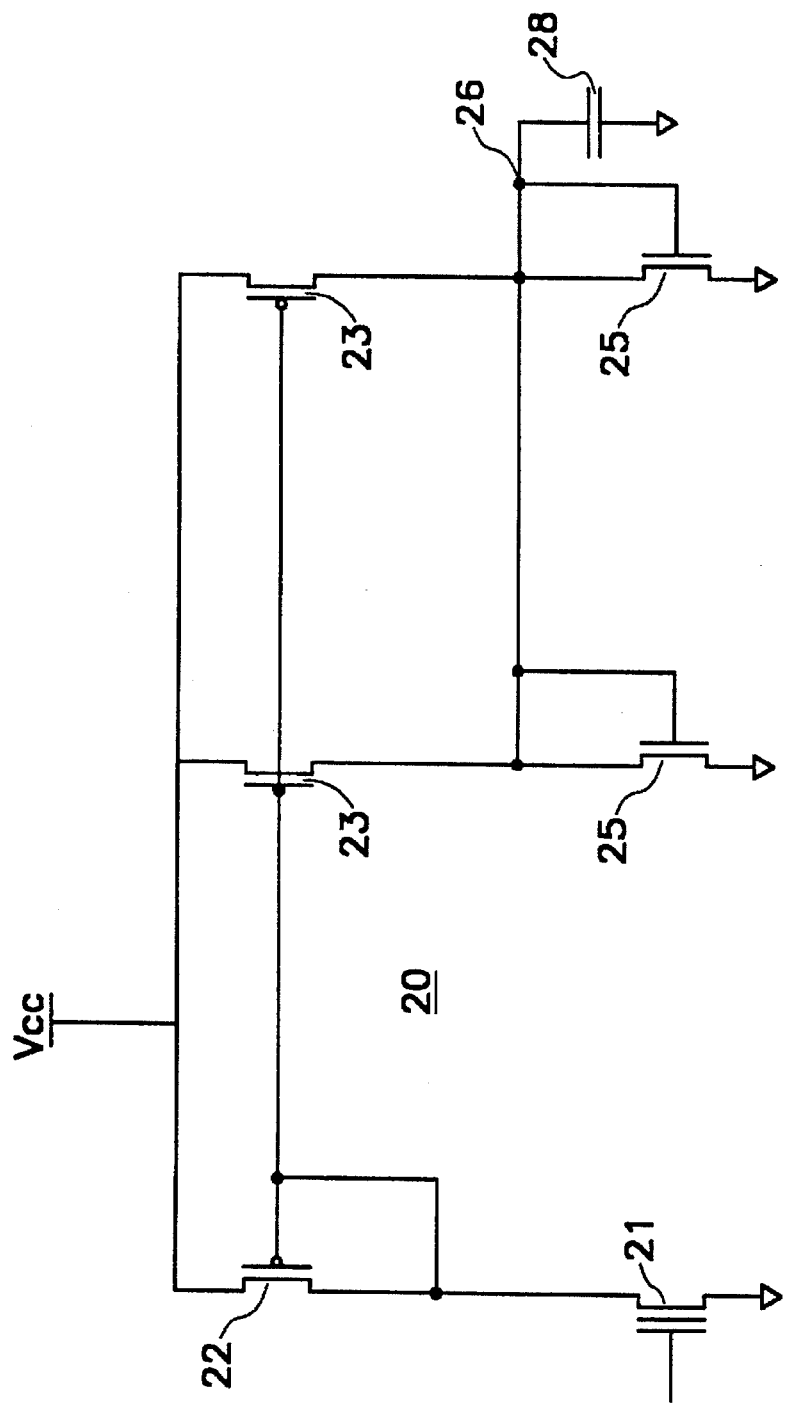
FIG. 2 is a block diagram of a voltage reference circuit which has been used in the prior art and may be used in accordance with the present invention.

FIG. 2 illustrates a prior art reference cell circuit 20 used to provide precise currents to the sense amplifiers of a flash EEPROM memory cell. The circuit 20 includes a flash EEPROM device 21 connected in series between a source of power and ground by a P transistor type device 22. An enabling signal is applied to the base of the flash device 21 so that current flows through the flash device 21 and the device 22. The device 22 is operated at saturation. The current through the device 22 is mirrored by a number of identically sized P type devices 23 joined in current-mirroring arrangements with the device 22. Each device 23 has a current path to ground through an N type transistor device 25. The voltage at the node 26 applied across the capacitor 28 is used to determine the value of the charge stored on an associated flash storage cell which is not shown in the figure. Typically, the number of mirroring transistors 23 is increased in order to obtain more current to more rapidly charge the node 26. However, this rapidly reaches a limiting point through parasitic capacitance. Moreover, this draws a substantial amount of current during operation of the circuit and therefore requires a substantial amount of power.

In the normal operation of such a reference circuit 20, the circuit 20 receives an enabling pulse which initiates its operation. The circuit 20 begins to turn on and goes through a process in which each of the internal elements reaches a steady state. Then the charging of the capacitance at the node 26 begins. As has been explained, since the current value through the individual transistors devices must be the same as the current through a typically flash EEPROM device, the current is limited. For that reason, the time to charge the node 26 after the internal elements of the reference circuit 20 reach steady state is longer than desirable.

The present invention may be used to furnish these precise reference voltages needed to accomplish the rapid power up of the flash memory while reducing the amount of power used. Of course, the present invention may be used to furnish precise reference voltages wherever they may be needed in digital systems. For example, the circuitry may be used with other storage arrays to bring about rapid turn on.

Figure 3:
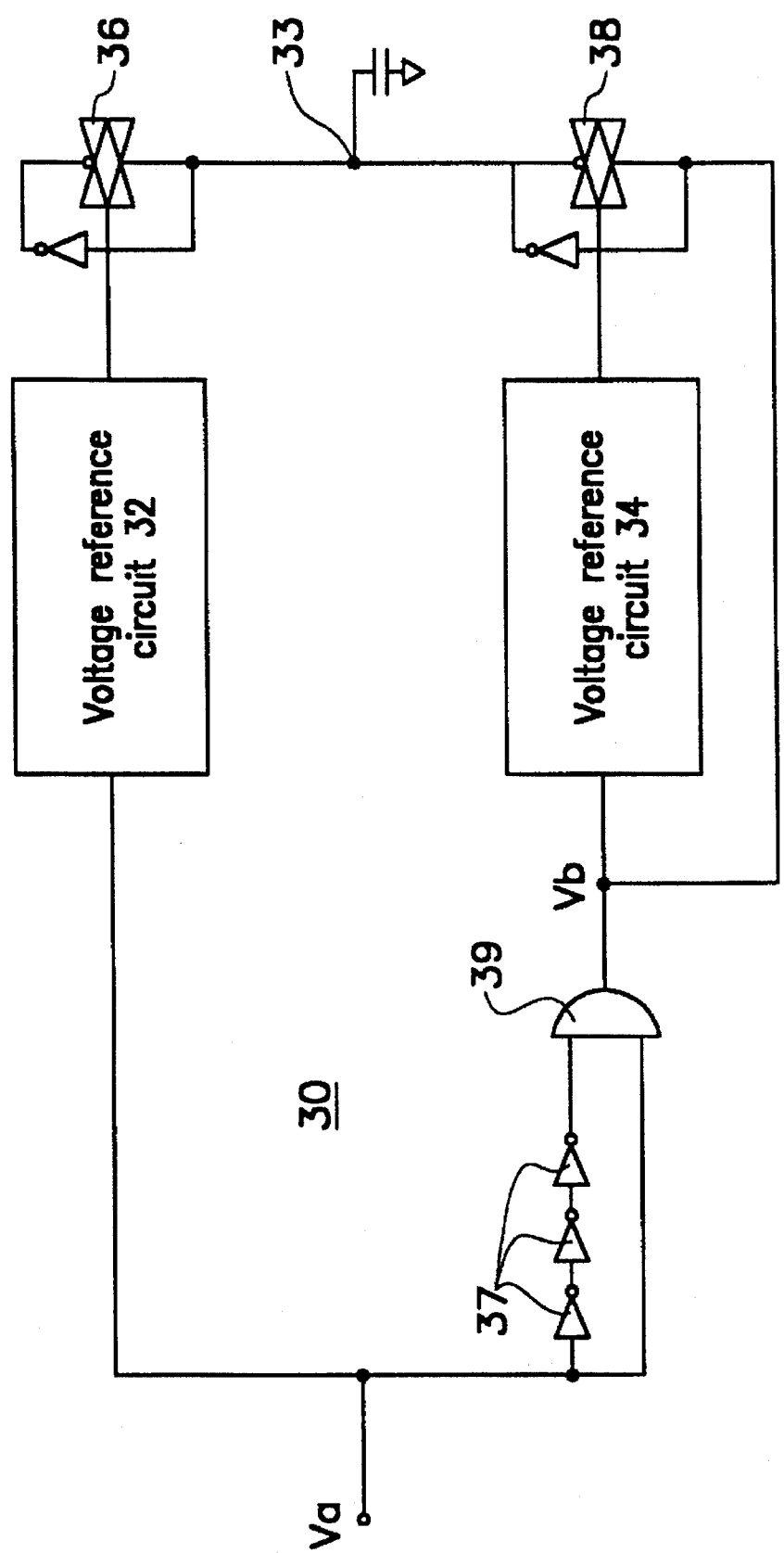
FIG. 3 is a block diagram of a circuit designed in accordance with the present invention.

Referring now to FIG. 3, there is illustrated a circuit 30 in accordance with the present invention by which the voltage at a circuit node may be rapidly raised to a precise value. As may be seen, the circuit 30 includes a first voltage reference circuit 32 and a second voltage reference circuit 34. Each of these circuits 32 and 34 may be like the circuit 20 of FIG. 2 or designed in some other well known manner to provide charging a node. Each of these circuits 32 and 34 is arranged so that it may be joined to a node 33 by the closing of a switch. For example, the first voltage reference circuit 32 is joined to the node 33 by a transmission gate switch 36; while the second voltage reference circuit 34 is joined to the node 33 by a transmission gate switch 38. The switches 36 and 38 are designed to connect only one of the circuits 32 or 34 to the node 33 at any time.

In the present invention, the time to charge the node 33 is reduced significantly over that of the circuit 20 of FIG. 2 by providing the second reference circuit 34. Although not necessary to the invention, the second reference circuit may have devices of larger dimensions than those of the first reference circuit so that more current may be furnished for a short time. When an enabling signal $V_a$ is furnished, each of the reference circuits 32 and 34 is enabled, the circuit 32 by the positive value $V_a$ and the circuit 34 by a positive value $V_b$ provided at the output of an AND gate 39 (generated by the value $V_a$ and the inverse of a previous negative value of $V_a$ delayed through an odd number of inverters). However, the transmission gate 38 is enabled by the signal $V_b$ and connects the reference circuit 34 to the node 33; while the transmission gate 36 is disabled by the signal $V_b$ so that the reference circuit 32 is disconnected from the node 33. Thus, the current through the reference circuit 34 charges the node 33 during a time in which the circuit 34 is reaching a steady state value without being connected to the load. This allows the circuit 34 to reach steady state more rapidly than if it were connected to the node 33 since it does not have to charge the load at the node 33.

A series of delay circuits 37 chosen to provide a time period sufficient to allow the circuit 34 to reach steady state are provided. When the delayed signal $V_a$ reaches both inputs to the AND gate 39, the output signal $V_b$ produced by the AND gate is inverted. This disables the input to the second reference circuit 34 and switches the state of each of the transmission gates 36 and 38. Switching the transmission gates 36 and 38 connects the reference circuit 32 to the node 33 and disconnects the reference circuit 34 from the node 33. Thus, the reference circuit 32 has its output applied to the node 33 as soon as it is ready to furnish its full current value to the node 33, while the voltage at the node 33 has been raised appreciably before this occurs by the circuit 34, the current through which need not be constrained as is the current through the circuit 32. This causes the node 33 to reach its full value significantly sooner than would be possible with the circuit 20 of FIG. 2. In one embodiment, the transfer of the node from one to the other reference circuit occurs when the node has reached about 90% of the full voltage level. The total effect is to allow the number of current mirroring legs in the first reference circuit to be reduced from five or six to two thereby reducing power consumption during the steady state condition of the circuitry, while increasing the speed with which the node is charged.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A circuit for rapidly raising the value of voltage at a circuit node to a predetermined precise level comprising:

first and second charging circuits;

a first switch for coupling the first charging circuit to the circuit node;

a second switch for coupling the second charging circuit to the circuit node; and a timing circuit responsive to an enabling signal for causing the second switch to couple the second charging circuit to the circuit node for a first time period, then using the second switch to decouple the second charging circuit subsequent to the first time period, and then causing the first switch to couple the first charging circuit to the circuit node thereafter.

2. A circuit for rapidly raising the value of voltage at a circuit node to a predetermined precise level as claimed in claim 1 in which the timing circuit comprises:

an AND gate furnishing its output as an input signal to the second charging circuit, the AND gate receiving an enabling signal at one input terminal and a delayed enabling signal at another input terminal; and a circuit for transferring the output of the AND gate to the second switch and the inverted output of the AND gate to the first switch.

3. A circuit for rapidly raising the value of voltage at a circuit node to a predetermined precise level as claimed in claim 2 in which the first and second switches are transmission gates.

4. A circuit for rapidly raising the value of voltage at a circuit node to a predetermined precise level as claimed in claim 1 in which the first charging circuit is a circuit for providing reference currents to sense amplifiers of a memory array.

5. A circuit for rapidly raising the value of voltage at a circuit node to a predetermined precise level as claimed in claim 1 in which the first charging circuit is a circuit for providing reference currents to sense amplifiers of a flash EEPROM memory array.

6. A circuit for rapidly raising the value of voltage at a circuit node to a predetermined precise level comprising:

first and second means for charging a circuit node;

first means for coupling the first means for charging a circuit node to the node;

second means for coupling the second means for charging a circuit node to the node;

means for providing signals to enable the first and second means for charging a circuit node; and timing means responsive to an enabling signal for causing the second switching means to couple the second means for charging a circuit node to the node for a first time period, then using the second switching means to decouple the second means for charging a circuit node subsequent to the first time period, and then causing the first switching means to couple the first means for charging a circuit node to the node thereafter.

7. A circuit for rapidly raising the value of voltage at a circuit node to a predetermined precise level as claimed in claim 6 in which the timing means comprises:

means for ANDing an enabling signal and a delayed enabling signal as input to the second means for charging a circuit node and as input to the second switching means; and means for inverting the input to the second means for charging a circuit node as input to the first means for charging a circuit node.

8. A circuit for rapidly raising the value of voltage at a circuit node to a predetermined precise level as claimed in claim 6 in which the first means for charging a circuit node is a circuit for providing reference currents to sense amplifiers of a memory array.

9. A circuit for rapidly raising the value of voltage at a circuit node to a predetermined precise level as claimed in claim 6 in which the first means for charging a circuit node is a circuit for providing reference currents to sense amplifiers of a flash EEPROM memory array.

10. A computer system comprising:

a central processing unit;

main memory;

a system bus; and secondary memory joined to the system bus including:

a circuit for rapidly raising the value of voltage at a circuit node to a predetermined precise level comprising:

first and second charging circuits;

first switch for coupling the first and charging circuit to the circuit node;

second switch for coupling the second charging circuit to the circuit node;

a source of enabling signals; and a timing circuit responsive to an enabling signal for causing the second switch to couple the second charging circuit to the circuit node for a first period, then using the second switch to decouple the second charging circuit subsequent to the first time period, and then causing the first switch to couple the first charging circuit to the circuit node thereafter.

11. A computer system as claimed in claim 10 in which the timing circuit comprises:

an AND gate furnishing its output as an input signal to the second charging circuit, the AND gate receiving an enabling signal at one input terminal and a delayed enabling signal at another input terminal; and a circuit for transferring the output of the AND gate to the second switch and the inverted output of the AND gate to the first switch.

12. A computer system as claimed in claim 11 in which the first and second switches are transmission gates.

13. A computer system as claimed in claim 10 in which the first charging circuit is a circuit for providing reference currents to sense amplifiers of a memory array.

14. A computer system as claimed in claim 10 in which the first charging circuit is a circuit for providing reference currents to sense amplifiers of a flash EEPROM memory array.

15. A computer system comprising:

a central processing means;

main memory means;

system busing means; and secondary memory means joined to the system busing means including:

circuit means for rapidly raising the value of voltage at a circuit node to a predetermined precise level comprising:

first and second means for charging a circuit node;

first switching means for coupling the first means for charging a circuit node to the node;

second switching means for coupling the second means for charging a circuit node to the node;

means for providing signals to enable the first and second means for charging a circuit node; and timing means responsive to an enabling signal for causing the second switching means to couple the second means for charging a circuit node to the node for a first time period, then using the second switching means to decouple the second means for charging a circuit node subsequent to the first time period, and then causing the first switching means to couple the first means for charging a circuit node to the node thereafter.

16. A computer system as claimed in claim 15 in which the timing means comprises:

means for ANDing an enabling signal and a delayed enabling signal as input to the second means for charging a circuit node and as input to the second switching means; and means for inverting the input to the second means for charging a circuit node as input to the first means for charging a circuit node.

17. A computer system as claimed in claim 15 in which the first means for charging a circuit node is a circuit for providing reference currents to sense amplifiers of a memory array.

18. A computer system as claimed in claim 15 in which the first means for charging a circuit node is a circuit for providing reference currents to sense amplifiers of a flash EEPROM memory array.

19. A method for rapidly charging a circuit node to a predetermined value comprising the steps of:

furnishing current from a first source of charging current to a limited period to raise the charge at the node to a level less than the predetermined level, and terminating the current from the first source and furnishing current from a second source of charging current to raise the charge at the node to the predetermined level.

20. The timing circuit of claim 1, wherein the first time period determines a duration in which the first charging circuit has reached a steady state following an input transition.

21. The timing means of claim 6, wherein the first time period determines a duration in which the first means for charging a circuit node has reached a steady state following an input transition.

22. The timing circuit of claim 10, wherein the first time period determines a duration in which the first charging circuit has reached a steady state following an input transition.

23. The method of claim 19, wherein the first time period determines a duration in which the second source has reached a steady state following an input transition.

24. A circuit for rapidly charging a first node to a predetermined level comprising:

an enable signal;

a switching element comprising: a switch output node coupled to the first node; a first input node; a second input node; and a select input;

a first reference circuit coupled between the enable signal and the first input node of the switching element;

a delay circuit comprising a delay input and a delay output; wherein the delay input is coupled to the enable signal and the delay output is coupled to the select input of the switching element; and a second reference circuit coupled between the delay output of the delay circuit and the second input node of the switching element.

25. The circuit of claim 24, wherein the select input of the switching element is used to select either the first input node or the second input node for coupling to the output node, while the unselected node is decoupled from the output node.

26. The circuit of claim 24, wherein the delay circuit uses the select input of the switching element to ensures that the second reference circuit charges the first node until the first reference circuit has reached a steady state and then transfers charging of the first node to the predetermined level to the first reference circuit.

* * * * *